Sept. 29, 1959 C. E. CANNON, JR., ET AL 2,906,016

METHOD FOR ASSEMBLING COMPONENTS

Filed Nov. 8, 1956 2 Sheets-Sheet 1

INVENTORS.
CHARLES E. CANNON, JR.
JOSEPH D. ROBERGE

BY [signature]

ATTORNEYS

Sept. 29, 1959 C. E. CANNON, JR., ET AL 2,906,016

METHOD FOR ASSEMBLING COMPONENTS

Filed Nov. 8, 1956

2 Sheets-Sheet 2

INVENTORS.
CHARLES E. CANNON, JR.
JOSEPH D. ROBERGE

BY [signature]
ATTORNEYS

United States Patent Office 2,906,016

Patented Sept. 29, 1959

2,906,016

METHOD FOR ASSEMBLING COMPONENTS

Charles E. Cannon, Jr., and Joseph D. Roberge, Lawrence, Ind.

Application November 8, 1956, Serial No. 621,185

2 Claims. (Cl. 29—407)

(Granted under Title 35, U.S. Code (1952), sec. 266)

The invention described herein may be manufactured and used by or for the Government of the United States of America for governmental purposes without the payment of any royalties thereon or therefor.

The present invention relates to a method for positioning components during assembly, and more particularly to a method for positioning electrical components such as resistors, capacitors and the like on printed circuitry boards.

In the manufacture of electronic equipment, particularly that which is to be airborne, present day designs require miniaturization of the equipment so as to require less volume and weight. In this respect, much use is presently being made of printed circuitry boards, and often a complete major component, such as an amplifier or power supply, is mounted on a single printed circuitry board. This, of course, often requires the attaching of a large number of electrical components, such as resistors, capacitors, rectifiers, diodes, and the like, on a single board, and consequently the assembly of these boards has become an arduous task.

Heretofore, in the assembly of components on a chassis or a printed circuitry board, the assembler was furnished a drawing or a blue print and assembled the components by following the views of the drawings. This method is time consuming as it requires a continual change of viewing the drawing and then viewing the assembly. Also, when large numbers of parts were to be assembled errors were often made as the components were connected in the wrong positions and consequently much time had to be spent in "trouble-shooting" the finished assembled unit.

The invention disclosed herein provides a novel way of aiding in the assembly of electrical components on chassis, terminal boards and the like by projecting onto the chassis or terminal board, as the case may be, a picture of the completed assembly and the components can readily be attached in their proper positions. The projected picture might be either black and white or colored, colored being preferred where they are large numbers of different parts, as different colors can be used to indicate the various resistors, capacitors, diodes, and the like. The assembler, after proper focusing of the picture on his work piece, merely has to position the various components on their respective indicated positions.

One of the objects of the present invention is to provide a method for facilitating the assembly of electrical components and the like on a chassis or a printed circuitry board. Another object is to project an image or a picture upon a chassis or a printed circuitry board, thereby designating the proper locations of objects that are to be mounted thereon.

Other objects and advantages of the present invention will be more readily appreciated as the same becomes better understood by reference to the following detailed description when considered in connection with the drawings wherein.

Figure 2:
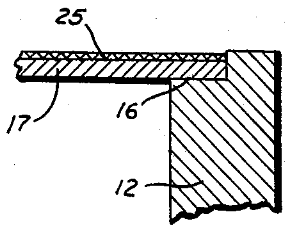
Fig. 2 is a fragmentary sectional view showing a terminal board positioned on a guide rail.
Figure 4:
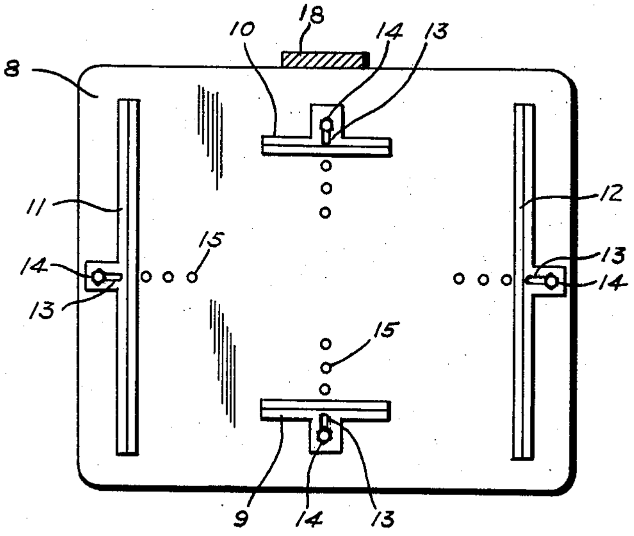
Fig. 4 is a view showing a base and guide rails arrangement.

Referring now to the drawings, there is shown a base 8 upon which there are slidably mounted four guide rails 9–12, inclusive, to form a locating fixture. These guide rails each have an elongated slot 13 therein, through which is passed a screw 14 that threadedly engages with one of a plurality of holes 15 in base 8. The holes 15 are sufficiently close together and the elongated slot 13 is sufficiently long to permit adequate adjustment of each guide rail. Two of the guide rails, namely 9 and 10, are substantially shorter than guide rails 11 and 12, and it can be seen that the pair of short rails can be positioned between the longer rails (11 and 12), as shown in Fig. 4 of the drawings, and consequently a much smaller size terminal board 17 can be mounted. As shown in Fig. 2 of the drawings, the guide rails 9–12, inclusive, each have a cut-out portion that forms a ledge 16 for a terminal board 17 or the like to be supported thereon.

A vertical stand 18 is attached to the base 8 by any suitable means, and a projector 19 is slidably connected to vertical stand 18 so that it can be positioned at various heights above the base 8. The ability of the projector to be positioned at various heights above the base 8 permits focussing of the image or picture that is to be projected onto the terminal board 17. The projector 19 might be of any commercial variety, such as, for example, a 35 mm. Model 1A, "Kodaslide," made by Eastman Kodak Co., Rochester, New York.

Figure 1:
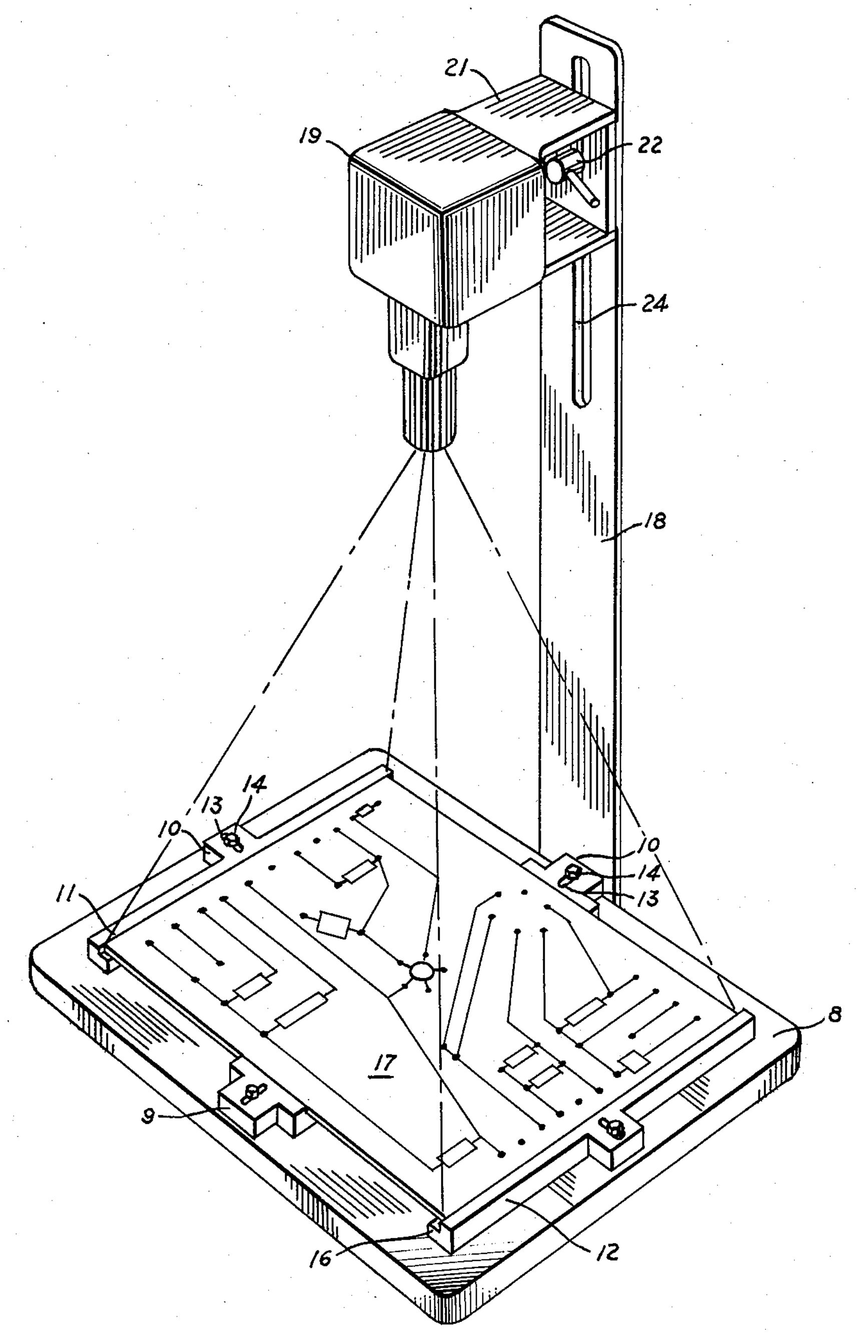
Fig. 1 is a perspective view of an embodiment of the present invention.
Figure 3:
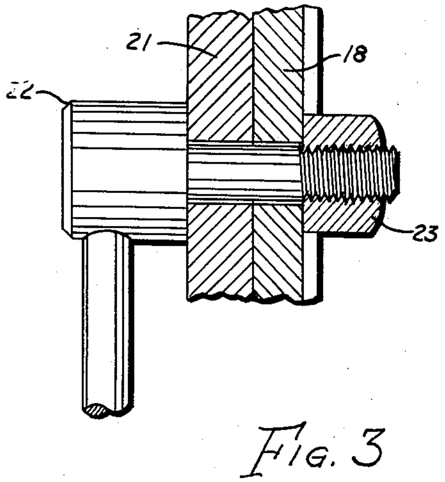
Fig. 3 is a fragmentary sectional view showing a locking device for holding a projector in position.

Referring now to Figs. 1 and 3 of the drawing, it can be seen that the projector 19 is connected to the vertical stand 18 through means of an adaptor block 21. A hand lock 22, which threadedly engages nut 23, is provided to tighten the adapter block 21 against the vertical stand 18. Vertical stand 18 has an elongated slot 24 through which passes the threaded portion 25 of hand lock 22, and thus it can be seen that projector 19 can be raised or lowered in height.

As printed circuitry boards are of a nonmetallic material, usually a laminated resinous material, the color and surface finish of these boards normally does not provide a satisfactory background to produce good contrast of the projected images thereon. Accordingly, it is sometimes desirable to apply a diffusion coating 25 to the boards that are to be assembled in order to increase the contrast between the background and the projected image. The diffusion coating 25 should be noncorrosive, should not interfere with the soldering of components on the boards, and should be readily removable. While various compositions might meet these standards, it has been found that a mixture of aluminum oxide and water provides a most satisfactory coating in that it creates a white background for contrast purposes and it is readily removable by brushing or washing. The mixture of aluminum oxide and water might be applied to the board by various methods such as dipping, brushing, or spraying.

In operation, a film slide is first made showing the various components that are to be assembled. Several different methods can be employed in making the film, such as, for example, the making of a scale drawing showing the various components and then photographing the drawing. Another method found to be highly satisfactory comprises using a terminal board of the kind to be assembled and placing thereon designs of components which are made of a color tape having an adhesive coating on one side. For example, an orange colored tape might indicate a resistor and a number thereon can represent either a part number or a resistance value. Other colors could represent capacitors, diodes, and the like, to distinguish the different components. After the various tapes are positioned on the board, a photograph is taken and a film slide then made.

After the film slide is placed in the projector 19, a terminal board that has been coated previously with a diffusion coating 25 of the kind described herein is placed on the ledges 16 of the guide rails 9–12, inclusive, which have been adjusted to accommodate the particular size board being mounted. The projector 19 can then be raised or lowered, as required, in order to focus the image being projected onto the terminal board 17. The assembler now sees the proper positions to locate the various components and these components can then be placed in position and soldered or otherwise connected to the terminal board. Once the guide rails 9–12, inclusive, have been adjusted to accommodate a particular size terminal board, and the projector 19 positioned the desired height above the terminal board, a large production run can be made without having to make adjustments each time a new terminal board is mounted on the guide rails.

It can thus be seen that the production of printed circuitry boards and the like can be greatly speeded up and that the possibility of error has been greatly reduced, as an assembler sees the exact positions to place various components on the boards.

Obviously, many modifications and variations of the present invention are possible in the light of the above teachings. It is therefore to be understood that the invention may be practiced otherwise than as specifically described.

What is claimed is:

1. A method of assembling components on printed circuitry boards grouped according to size comprising the steps of first adjusting guide rails of a locating fixture to accommodate a printed circuitry board representative of a group of boards, next positioning a printed circuitry board representative of said group in said locating fixture, then adjusting a projector in height above said board in order to properly focus a projected image onto said board representative of said group, then projecting onto said located board images of components to be mounted on said board, then placing components on said board in positions indicated by said projected images, each said component corresponding to the indication of its projected image, and then connecting said components to said printed circuitry board.

2. A method of assembling components on printed circuitry boards as set forth in claim 1 wherein said boards are given a diffusion coating before positioning in said fixture thereby increasing the visibility of said projected images.

References Cited in the file of this patent

UNITED STATES PATENTS

| | | |
|---|---|---|
| 1,720,232 | North | July 9, 1929 |
| 2,145,116 | Howard | Jan. 24, 1939 |
| 2,155,248 | Adams | Apr. 18, 1939 |
| 2,246,920 | Kromholz | June 24, 1941 |
| 2,418,007 | Barnes | Mar. 25, 1947 |
| 2,543,561 | Tracy | Feb. 27, 1951 |
| 2,748,829 | Korenak | June 5, 1956 |